United States Patent
Mehrotra et al.

(10) Patent No.: US 7,199,020 B2
(45) Date of Patent: Apr. 3, 2007

(54) NITRIDATION OF STI LINER OXIDE FOR MODULATING INVERSE WIDTH EFFECTS IN SEMICONDUCTOR DEVICES

(75) Inventors: Manoj Mehrotra, Plano, TX (US); Hiroaki Niimi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 141 days.

(21) Appl. No.: 11/103,104

(22) Filed: Apr. 11, 2005

(65) Prior Publication Data

US 2006/0226559 A1    Oct. 12, 2006

(51) Int. Cl.
*H01L 21/762*    (2006.01)
(52) U.S. Cl. ............... 438/424; 438/425; 438/435; 257/E21.547
(58) Field of Classification Search ............... 438/424, 438/425, 435, FOR. 227; 257/E21.547
See application file for complete search history.

(56) References Cited

U.S. PATENT DOCUMENTS

| | | | |
|---|---|---|---|
| 4,238,762 A * | 12/1980 | McWilliams et al. ....... 257/524 |
| 5,719,085 A | 2/1998 | Moon et al. |
| 5,807,789 A | 9/1998 | Chen et al. |
| 5,863,827 A | 1/1999 | Joyner |
| 5,937,309 A | 8/1999 | Chuang |
| 5,940,718 A * | 8/1999 | Ibok et al. ............... 438/440 |
| 5,945,704 A * | 8/1999 | Schrems et al. ........... 257/301 |
| 5,956,598 A | 9/1999 | Huang et al. |
| 5,960,276 A | 9/1999 | Liaw et al. |
| 5,990,515 A * | 11/1999 | Liu et al. ................ 257/316 |
| 6,040,232 A | 3/2000 | Gau |
| 6,150,212 A * | 11/2000 | Divakaruni et al. ....... 438/244 |
| 6,153,480 A * | 11/2000 | Arghavani et al. ........ 438/296 |
| 6,180,490 B1 | 1/2001 | Vassiliev et al. |
| 6,225,187 B1 | 5/2001 | Huang et al. |
| 6,245,639 B1 | 6/2001 | Tsai et al. |
| 6,323,106 B1 * | 11/2001 | Huang et al. ............... 438/433 |
| 6,391,784 B1 * | 5/2002 | Ibok ........................ 438/702 |
| 6,524,930 B1 | 2/2003 | Wasshuber et al. |
| 6,562,675 B1 | 5/2003 | Watt |
| 6,576,558 B1 | 6/2003 | Lin et al. |
| 6,642,124 B1 * | 11/2003 | Yamauchi .................. 438/425 |
| 6,649,461 B1 | 11/2003 | Lai et al. |
| 6,667,224 B1 | 12/2003 | Watt et al. |
| 6,717,231 B2 | 4/2004 | Kim et al. |
| 6,740,944 B1 | 5/2004 | McElheny et al. |
| 6,849,919 B2 * | 2/2005 | Sumino et al. ............. 257/510 |

(Continued)

OTHER PUBLICATIONS

U.S. Appl. No. 10/899,663, filed Jul. 27, 2004, Mehrotra et al.

(Continued)

*Primary Examiner*—George Fourson
(74) *Attorney, Agent, or Firm*—Frederick J. Telecky, Jr.; W. James Brady, III

(57) ABSTRACT

A method (1300) of forming a semiconductor device comprising an isolation structure is disclosed, and includes forming a trench region within a semiconductor body (1308). Then, surfaces of the trench region are nitrided (1310) via a nitridation process. An oxidation process is performed that combines with the nitrided surfaces (1312) to form a nitrogen containing liner. Subsequently, the trench region is filled with dielectric material (1316) and then planarized (1318) to remove excess dielectric fill material.

17 Claims, 10 Drawing Sheets

U.S. PATENT DOCUMENTS

| | | |
|---|---|---|
| 6,939,791 B2* | 9/2005 | Geffken et al. ............. 438/622 |
| 2002/0004282 A1* | 1/2002 | Hong ......................... 438/424 |
| 2002/0055236 A1* | 5/2002 | Chen ......................... 438/437 |
| 2002/0076900 A1* | 6/2002 | Park et al. .................. 438/424 |
| 2002/0127817 A1* | 9/2002 | Heo et al. ................... 438/424 |
| 2003/0162366 A1* | 8/2003 | Puchner et al. ............. 438/446 |
| 2003/0181004 A1 | 9/2003 | Watt |
| 2004/0005750 A1* | 1/2004 | Chen et al. ................. 438/197 |

OTHER PUBLICATIONS

U.S. Appl. No. 10/899,664, filed Jul. 27, 2004, Chatterjee et al.
U.S. Appl. No. 10/899,644, filed Jul. 27, 2004, Mehrad et al.

* cited by examiner

NITRIDATION OF STI LINER OXIDE FOR MODULATING INVERSE WIDTH EFFECTS IN SEMICONDUCTOR DEVICES

FIELD OF INVENTION

The present invention relates generally to semiconductor devices and more particularly to methods for forming shallow trench isolation structures in the manufacture of semiconductor devices.

BACKGROUND OF THE INVENTION

In the area of semiconductor device fabrication, the MOS transistor is a basic building block, wherein the transistor can be controlled to operate either in a digital or analog manner. In the fabrication of MOS transistors, source and drain regions are doped opposite that of a body region or well region in a semiconductor substrate. For example, as illustrated in prior art FIG. 1, source/drain regions 12 are formed in a semiconductor body 14 of a MOS transistor, wherein the source/drain regions 12 are an n-type material and the body region 14 is a p-type material (an NMOS transistor). A gate structure 16, for example, a polysilicon gate electrode 18 overlying a gate dielectric 20, overlies a channel region 22 of the semiconductor body. Sidewall spacers 24 reside on lateral edges of the gate structure 16 to facilitate the spacing of extension regions 26 associated with the source/drains 12. Based on the gate structure 16, a distance between the source/drain regions 12 is defined, which is often referred to as a channel length "L", while a depth of the transistor, or extent in which the transistor extends transverse to the channel, is often referred to as a width "W" of the device. The width-to-length ratio (W/L) is a factor that influences the drive current of the device, as well as other device performance characteristics.

As transistor devices are scaled down to improve device density, both the width "W" and the channel length "L" dimensions are reduced, giving rise to various fabrication and device performance issues. One problem associated with a reduction in the transistor width "W" is experienced when shallow trench isolation (STI) is employed for device isolation, and that problem is sometimes referred to as the inverse narrow width effect (INWE). As the transistor width is reduced the transistor drive current per unit width changes due to the edge effects that now play an appreciable role in transistor behavior. The gate dielectric thickness, its dielectric constant, and the channel orientation are different at the edges than at the planar center of the channel. The dopant concentration at the edges is different at than the center due to dopant segregation and STI stress induced diffusion at the interface. There is also the impact of STI and liner stress on the mobility near the edge of the channels. The STI edge may not be completely planar and may have a gate wrap around (more gate control) or less gate control depending upon the step height (difference between the top of the oxide over field and the top of the active regions). All these factors alter (raise or lower) threshold voltages of the narrow width device resulting in either reduction or increase in drive current per unit width. When the threshold voltage increases for narrow width devices and the drive current per unit width is reduced it results in weaker SRAM transistors which result in slower memory for example as well as functional problems for given SRAM designs. In such cases there is a need to improve the narrow width effects by mitigating the narrow width effects.

Referring to prior art FIG. 2, a portion of a partially fabricated semiconductor device is illustrated, wherein a plurality of isolation structures 30, or STI trenches, are formed in the semiconductor body 14, thereby separating the body into isolation regions 32 and active areas 34, respectively. Subsequently, transistor devices such as MOS transistors are formed in the active areas 34, wherein a width dimension "W" of the MOS transistors extends between the isolation structures 30 as illustrated. As MOS transistor scaling continues, the distance "W" between the isolation structures decreases.

As illustrated in prior art FIG. 3, after source/drain regions 12 and gate structures 16 are formed in the active areas, defined portions 40 of the active regions near the STI trenches 30 can suffer negative effects, such as undesired dopant diffusion and/or other INWE, due to their proximity to the STI trenches. For relatively large width devices, these negative effects are of minimal consequence. However, at smaller/narrower widths, these negative effects can become problematic.

For example, as illustrated in prior art FIGS. 4 and 5, a plan view of two portions of a MOS transistor are provided, wherein the two devices have differing transistors widths. For example, in prior art FIG. 4, an active area 50 is defined between two laterally extending STI isolation regions 52. A conductive gate electrode 54 extends vertically across the active area between the two isolation regions 52, thereby defining a channel region 56 thereunder in the active area. Due to the INWE, a region 58 exists under the channel near the STI that contributes to altering (reducing or increasing) threshold voltage. For a device width W1, the net impact of the region 58 due to the INWE is relatively insignificant, however, as illustrated in prior art FIG. 5, for smaller transistor widths W2, the INWE will have a substantially greater impact on the resulting device performance.

Therefore there remains a need in the art for improved STI processes and techniques that reduce or alter the impact of the INWE in order to reduce or mitigate the device performance problems associated therewith.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides methods for forming isolation structures and STI trenches in a semiconductor device, which may be carried out in a variety of semiconductor manufacturing processes. Device operation is facilitated by nitridation and liner formation after trench formation that modulates inverse width effects. The liner is formed and contains nitrogen, which can mitigate problems associated with inverse width effects. Additionally, the nitrogen containing liner can increase drive current.

In accordance with one aspect of the invention, a method of forming a semiconductor device comprising an isolation structure includes forming a trench region within a semiconductor body. Then, surfaces of the trench region are nitrided via a nitridation process. An oxidation process is performed that combines with the nitrided surfaces to form a nitrogen containing liner. Subsequently, the trench region is filled with dielectric material and then planarized to remove excess dielectric fill material.

In accordance with another aspect of the invention, a method of forming a semiconductor device containing an isolation structure includes forming a pad oxide over a device. A hard mask layer is formed on the pad oxide. A resist layer is formed on the hard mask that exposes the hard mask layer within isolation regions and covers the hard mask layer within active regions of the device. The hard mask layer is patterned to remove the exposed portions of the hard mask layer. A trench etch is then performed to form trench regions in the isolation regions. Thereafter, a nitridation process is performed that forms nitrided surfaces within the trench regions. An oxidation process forms a nitrogen containing liner on the surfaces of the trench region. After which, a dielectric fill process is performed that fills the trench regions with dielectric material. Subsequently, a planarization process is performed that removes excess dielectric fill material.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
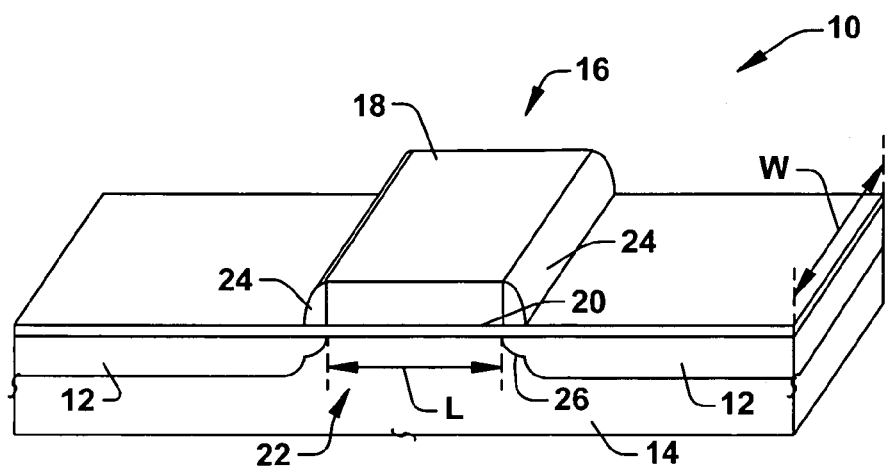
FIG. 1 is a prior art fragmentary perspective view of a MOS transistor.
Figure 2:
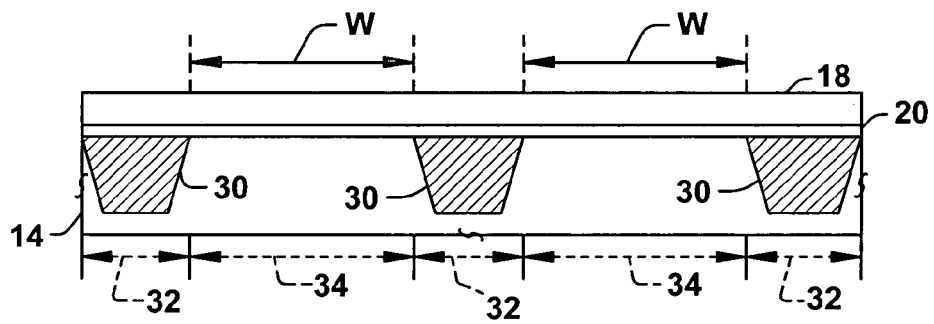
FIGS. 2 and 3 are prior art partial side elevation views in section illustrating a portion of a MOS transistor in various points in a manufacturing process that experiences the inverse narrow width effect (INWE).
Figure 3:
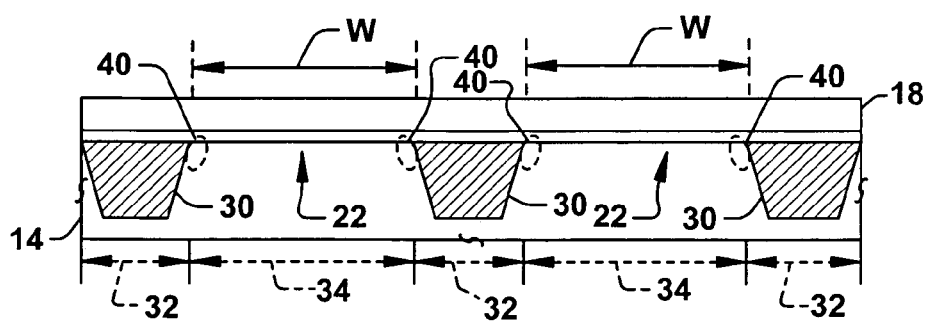
Figure 4:
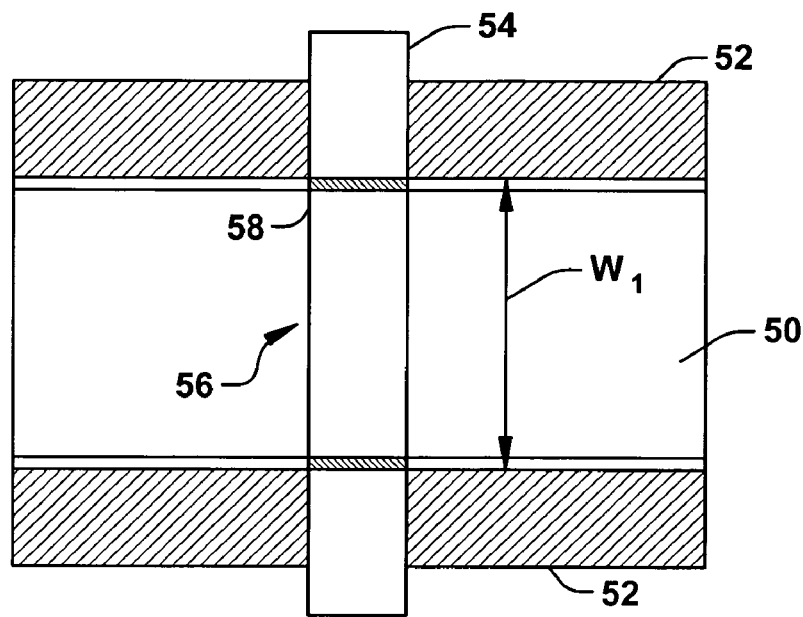
FIGS. 4 and 5 are prior art partial side elevation views in section illustrating a MOS transistor and how, as a transistor dimension decreases in a width direction, the INWE becomes more pronounced.
Figure 5:
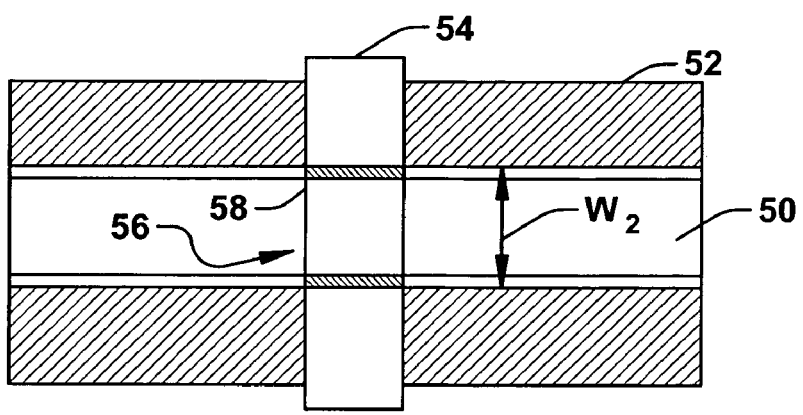
Figure 6:
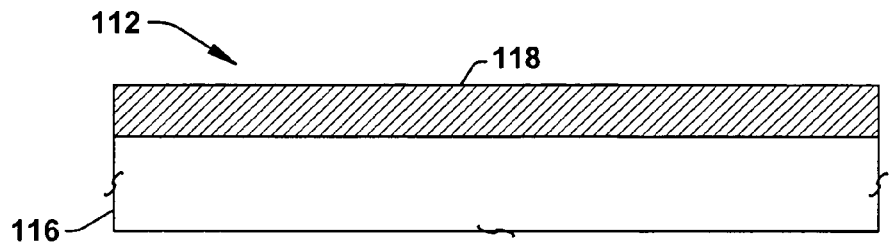
FIGS. 6–12 are prior art partial side elevation views in section illustrating a conventional shallow trench isolation process for providing isolation between active areas in a semiconductor device.
Figure 7:
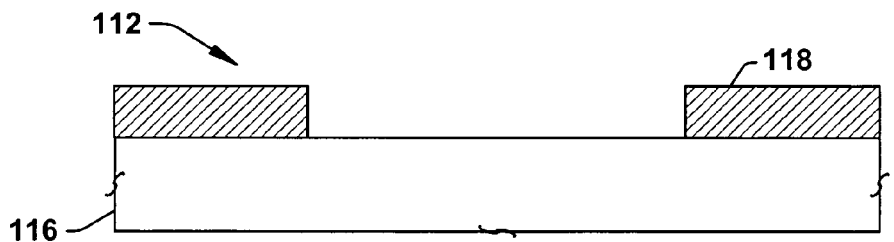

The present invention will now be described with reference to the attached drawings, wherein like reference numerals are used to refer to like elements throughout. The invention relates to methods for forming isolation structures and trenches in semiconductor devices, in which the negative impacts of the INWE are eliminated or substantially mitigated without the addition of extra mask steps. In addition, the method according to one exemplary aspect of the invention advantageously operates to improve a balance or minimize an imbalance of the threshold voltage performance of NMOS and PMOS transistors.

In order to fully appreciate the various aspects of the present invention, a brief description of a conventional STI fabrication process as appreciated by the inventors of the present invention will be discussed. After a discussion thereof, the various aspects of the present invention will be disclosed and more fully appreciated.

In the fabrication of semiconductor devices, isolation structures are formed between active areas in which electrical devices such as transistors, memory cells, or the like, are to be formed. The isolation structures, in this case shallow trench isolation (STI) structures, are typically formed during initial processing of a semiconductor substrate, prior to the formation of such electrical devices.

STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches. A mask, such as a resist mask, is formed over the substrate surface and patterned to expose only the isolation regions, with the prospective active device regions covered. An anisotropic (e.g., "dry") etch is then performed to form a trench through the substrate. Once the trench is etched, dielectric material is deposited to fill the trench with oxide. Thereafter, the device is commonly planarized using a chemical mechanical polishing (CMP) process.

Figure 8:
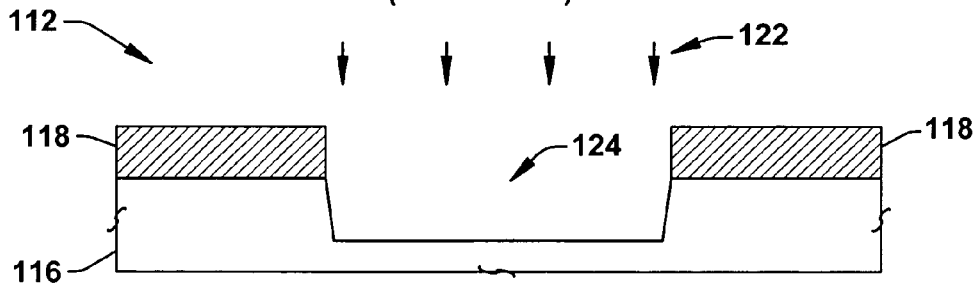
Figure 9:
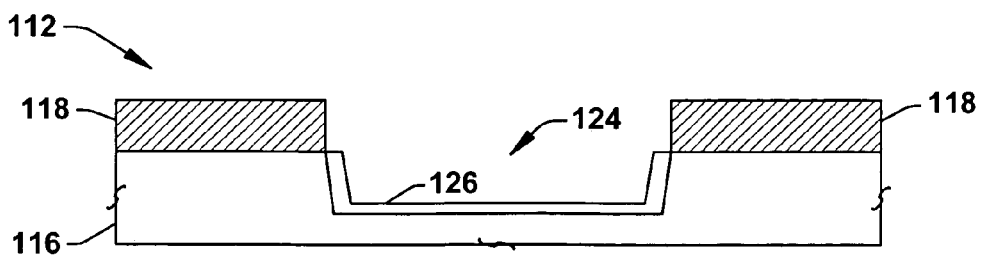

An example of a conventional STI process is illustrated in prior art FIGS. 6–12 to form trench isolation structures in a semiconductor device 112. In prior art FIG. 6, a mask 118 is formed over the device. The mask 118 is comprised of an etch resistant material such as silicon nitride or other suitable masking material. The mask is patterned in FIG. 7 to expose isolation regions of the device and cover active regions of the device. An etch 122 (e.g., a dry etch) is performed to form a trench 124 into the body region 116 as shown in FIG. 8. Subsequently, an oxide liner 126 is optionally formed in the trench 124 as shown in FIG. 9. The oxide liner 126 is formed by a thermal growth process.

Figure 10:
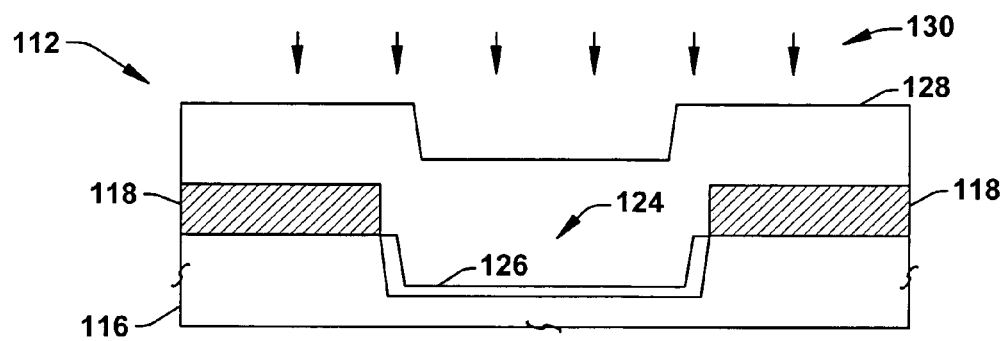
Figure 11:
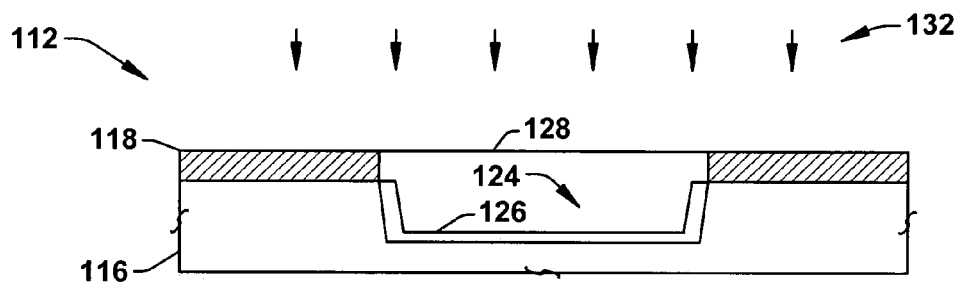
Figure 12:
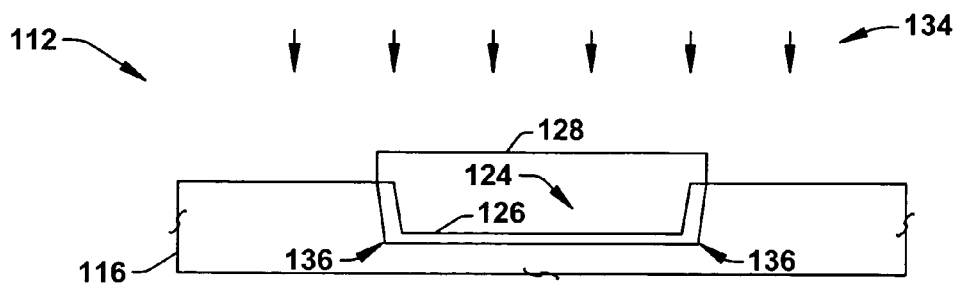

Once the trench 124 and the liner 126 are formed, a dielectric material 128 is deposited in prior art FIG. 10 via a deposition process 130 to fill the trench 124 and also to cover the active regions of the device 112. In prior art FIG. 11, a chemical mechanical polishing (CMP) or other planarization process 132 is used to planarize the upper surface of the device 112, which exposes the remainder of the mask 118. Following planarization, the mask 118 is removed via a mask removal process 134 in prior art FIG. 12 to complete the isolation process, leaving the STI structure 128 in the trench 124.

The inventors of the present invention note that the conventionally formed STI structure 128 can lead to inverse width effects if the device 112 has a relatively small width dimension. These inverse width effects can degrade drive current, undesireably alter threshold voltages, and the like.

Figure 13:
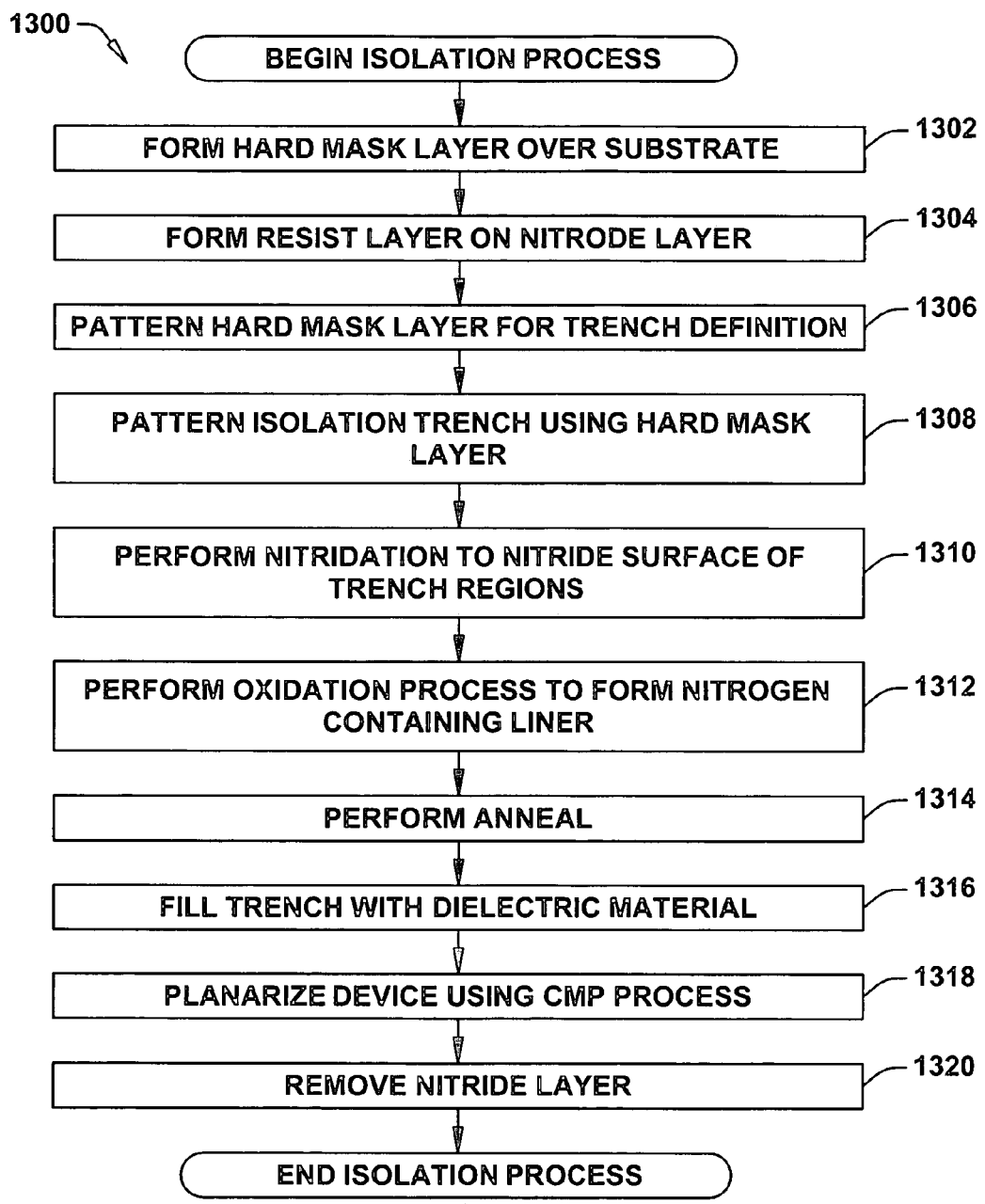
FIG. 13 is a flow chart diagram illustrating a method for forming isolation structures in a semiconductor device in accordance with an aspect of the present invention.

Referring now to FIG. 13, a flow diagram illustrating a method 1300 for forming isolation structures in a semiconductor device in accordance with an aspect of the present invention is illustrated. While the method 1300, and other methods according to the invention, are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Beginning at block 1302, a hard mask layer is formed over a silicon semiconductor substrate or body of a semiconductor device. A relatively thin pad oxide layer may be formed on the semiconductor substrate prior to formation of the hard mask layer by thermally growing oxide. The hard mask is comprised of a suitable material, such as nitride (Si3N4) and is deposited, for example, by a low pressure chemical vapor deposition (LPCVD) or other suitable deposition process. The hard mask layer mitigates damage to active regions of the device during formation of isolation regions.

Continuing at block 1304, a resist mask layer is formed over the device and on the hard mask layer that covers the active regions and exposes isolation regions. A photoresist material is deposited on the hard mask layer and patterned to expose the hard mask layer within the isolation regions and yet remain and cover the hard mask layer within the active regions.

The hard mask layer is then patterned using a suitable etch/patterning process and the resist mask layer as a mask at block 1306 to expose underlying silicon of the isolation regions. The resist layer may then be removed by an ashing process. Subsequently, a trench formation process is performed at block 1308 that etches the exposed portions of the silicon substrate to a selected depth, thereby forming trench regions. The etch process employed is typically selective to the material employed in the mask layer and etches into the semiconductor substrate within the exposed isolation regions so as to form the trench region having sidewalls, and a bottom. The width of the insulation trench is associated with the isolation opening(s) in the mask layer.

A number of suitable etch processes can be employed to form the trench regions at block 1308. For example, a dry etch can be employed, which works well with hard mask layers. Additionally, reactive ion etching (RIE) can be employed. For example, a single or multi-step RIE etch process may be performed which removes material in the exposed isolation regions. Other suitable etch processes can also be employed.

At block 1310, a nitridation process is performed that nitrides a surface of the sidewalls and bottom of the trench region. The nitridation doesn't necessarily form a nitride compound. A number of nitridation processes can be employed, such as plasma nitridation. As an example, a suitable plasma nitridation process is performed using pulsed RF plasma with approx 30–60% duty pulse with N2 gas flow of approx 300–700 sccm, pressure of 5–30 mTorr for 45 sec. N$_2$O oxidation is done at 1000–1150C at 200–400 Torr for 45 sec under pure N$_2$O flow of approx. 9500 sccm.

An oxidation process is then performed at block 1312 that forms a nitrogen containing liner, such as nitrous oxide (N2O), nitric oxide, or combination thereof liner. The oxidation process can be a thermal oxidation process and/or another suitable oxidation process. The concentration of nitrogen can vary throughout the nitride containing oxide liner layer. However, a nitrogen profile having a relatively higher nitrogen concentration near an interface between the silicon substrate and the liner can increasingly mitigate problems resulting from inverse width effects.

It is noted that the inventors of the present invention contemplate alternate aspects of the invention that include other processes for forming nitrous oxide, nitric oxide, and other liners containing nitrogen. It is also noted the nitridation performed at block 1310 prior to formation of the nitrogen containing liner at block 1312 facilitates increasing the nitrogen composition at the silicon/liner interface.

Subsequently, an anneal is performed at block 1314 after the formation of the nitrogen containing liner (e.g., nitrous oxide). The anneal serves to repair damage and/or mitigate uniformities within the trench region and the nitrogen containing liner layer.

At 1316, the trench is filled with dielectric material such as SiO$_2$ or other electrically isolating material so as to provide electrical isolation between active regions on either side of the isolation trench. The trench filling operation at 1316 may comprise forming or depositing dielectric material over the device to cover the hard mask layer in the active regions and to fill the trenches in the isolation regions thereof. The trench fill material may be deposited at 1316 using any appropriate deposition techniques, for example, such as high density plasma (HDP) oxide deposition, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS).

The device is then planarized at 1318 to expose a portion of the hard mask layer in the active regions, leaving a generally planar upper surface with portions of the nitride layer and a remaining portion of the fill material in the trench exposed. The remaining hard mask material is stripped or removed at 1320, for example, using a wet etch process selective so as to remove hard mask material and to stop on or before the silicon substrate (e.g., a pad oxide layer can be employed) without damaging the underlying silicon or other semiconductor material in the active regions of the device. The isolation method 1300 then ends. Thereafter, transistors, memory cells, and/or other electrical devices may be formed in the active regions using semiconductor processing techniques as are known.

The presence of nitrogen in the liner layer serves a number of purposes. The threshold voltages for relatively narrow width NMOS devices is generally reduced by the presence of nitrogen in the liner layer and the threshold voltages for relatively narrow PMOS devices is generally increased (decreased in magnitude) by the presence of nitrogen in the liner layer. Narrow width devices are typically defined as devices whose width is small enough that inverse width effects substantially deteriorate operation of the devices using conventional shallow trench isolation processing. Generally, narrow width devices of interest are under 200 nm in width.

The above alterations of threshold voltages facilitate improving drive current for transistor devices. For example, as a consequence, SRAM drive current over the SRAM load is increased thereby increasing the SRAM beta ration. The presence of nitrogen also reduces undesired diffusion of implanted source/drain dopants toward the surfaces of the active regions thereby preventing/mitigating the rise of threshold voltage for relatively narrow width devices.

Additionally, the nitrogen containing liner induces tensile stress into the channel regions. As a result, NMOS device performance can be improved from the stress. PMOS device performance is not negatively impacted because of the orientation of the device and directionality of the induced tensile stress.

Referring now to FIGS. 14A to 14I, a semiconductor device is illustrated at various stages of fabrication in accordance with the exemplary method 1300 of FIG. 13. The various stages of fabrication are exemplary in nature and are intended to facilitate a better understanding of the present invention. It is noted at this point that the illustrations provided herein are not necessarily drawn to scale, and that the above method 1300 may be employed in processing structures other than those illustrated in the following figures, and further that the structures illustrated and described herein may be fabricated according to other techniques.

Figure 14A:
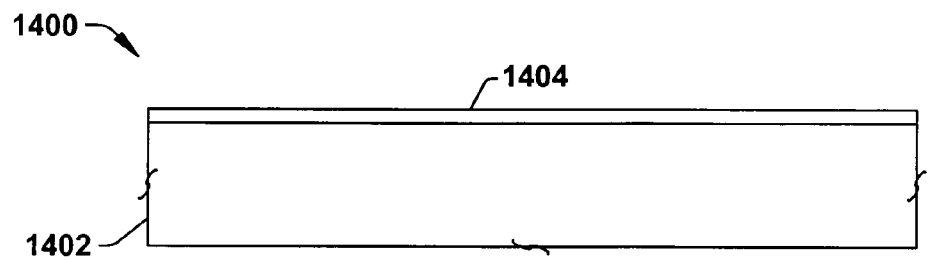
FIGS. 14A to 14I are a plurality of diagrams illustrating a semiconductor device at various stages of fabrication in accordance with the method of FIG. 13.

In FIG. 14A, the semiconductor device 1400 is illustrated comprising a semiconductor body (e.g., a substrate) 1402, such as silicon. An oxidation process (not shown) is initially employed to grow a pad oxide layer 1404 over the top surface of the substrate 1402 as illustrated in FIG. 14A.

Figure 14B:
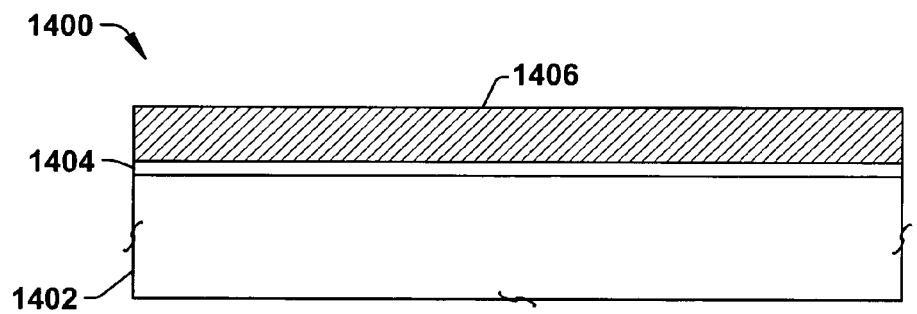

FIG. 14B illustrates a hard mask layer 1406 formed on the pad oxide layer 1404 by depositing a hard mask material, such as silicon nitride. An exemplary process for forming the hard mask layer is a low pressure chemical vapor deposition (LPCVD) process of $Si_3N_4$ or equivalent nitride or equivalent material.

Figure 14C:
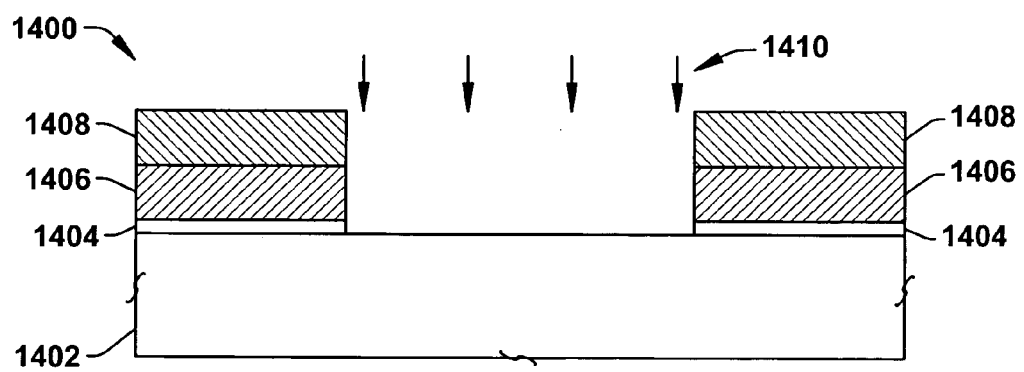

Thereafter, in FIG. 14C, a patterned mask 1408 (e.g., a developed photoresist) is formed to cover active regions of the device 1400 while exposing the hard mask layer 1406 in the isolation regions for subsequent trench formation therein. A dry etch process 1410 is employed in FIG. 14C, in one example, to etch through the hard mask layer 1406 and at least a portion of the pad oxide layer 1404 to substantially expose the semiconductor body associated with the isolation region. Alternatively, the etch process 1410 may etch only the hard mask layer 1406 and stop on the pad oxide layer 1404. In yet another alternative, the etch process 1410 may etch all of the exposed hard mask layer 1406 and the underlying pad oxide layer 1404 and land on the underlying semiconductor material. In another example, the etch process 1410 is employed to partially etch the hard mask layer 1406, wherein some portion of hard mask layer remains overlying the isolation regions. In one example, a remaining amount of the hard mask layer 1406 may be about 1,000 Angstroms thick, however, other remaining thicknesses are contemplated by the present invention.

Figure 14D:
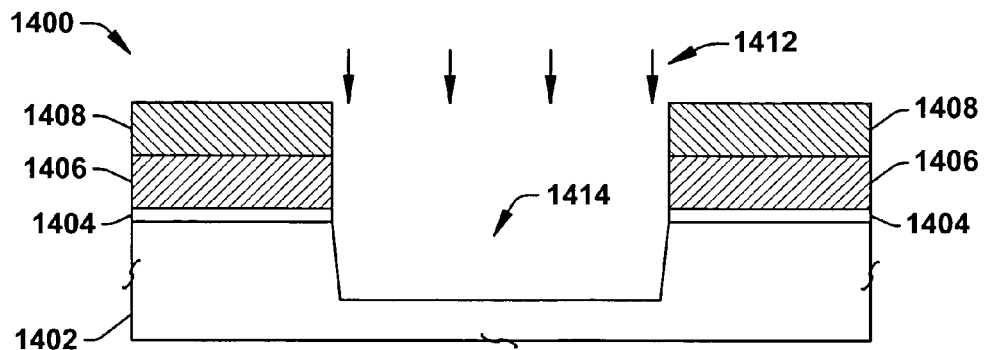

Continuing with respect to FIG. 14D, an etch process 1412 is performed using the resist mask 1408 to form isolation trench regions 1414 to a depth and width in the isolation regions, where the trench regions comprises sidewalls and a bottom. Subsequently, the resist mask 1408 is removed by a suitable process, such as an ashing process.

Figure 14E:
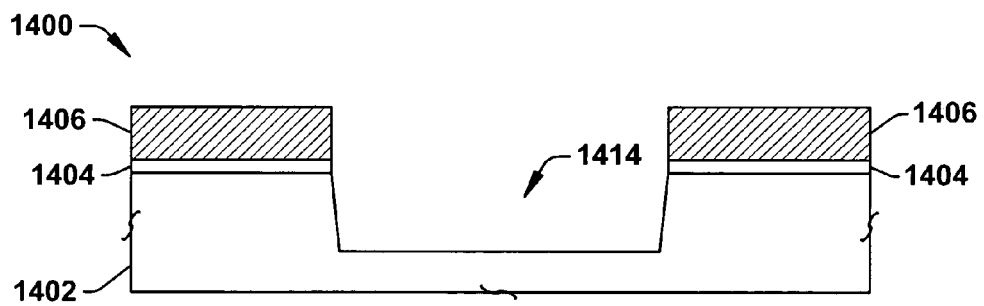

A nitridation process is then performed that nitrides surfaces of the sidewalls and bottom of the trench regions 1414. Typically, a plasma nitridation process is employed. The nitridation process parameters, including source materials and duration, can be adjusted to obtain a desired nitridation of the surfaces. FIG. 14E depicts the semiconductor device 1400 after removal of the resist mask 1408 and performance of the nitridation process.

Figure 14F:
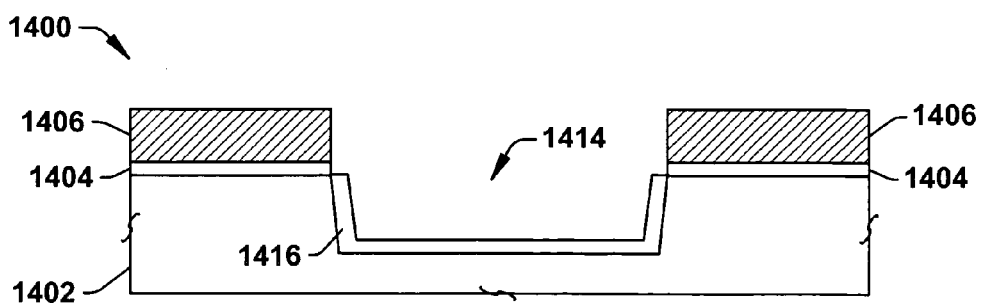

Thereafter, an oxidation process is performed that format a nitrogen containing liner 1416 on the sidewalls and bottom of the trench regions 1414 as shown in FIG. 14F. The liner can be formed by oxidation of the exposed portions of the trench 1414 using a thermal growth process. Such an oxidation process forms a nitrogen containing liner 1416 such as nitrous oxide, nitric oxide, and combinations thereof, with a varied nitrogen concentration profile. Subsequently, an anneal process is optionally performed that repairs damage incurred during the fill process.

Figure 14G:
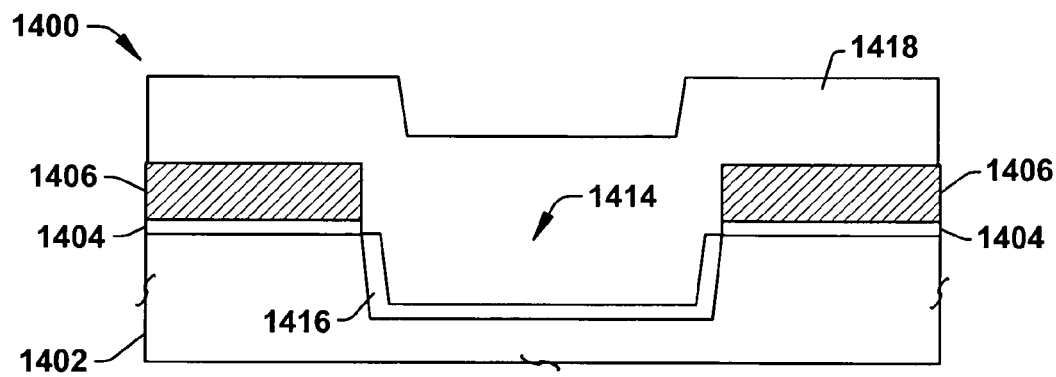

The trench regions 1414 are then filled in with electrically isolating, dielectric material 1418 via a deposition process as shown in FIG. 14G. The process involves a suitable deposition methodology, such as depositing $SiO_2$ or other isolating material using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials and deposition processes are contemplated as falling within the scope of the present invention.

Figure 14H:
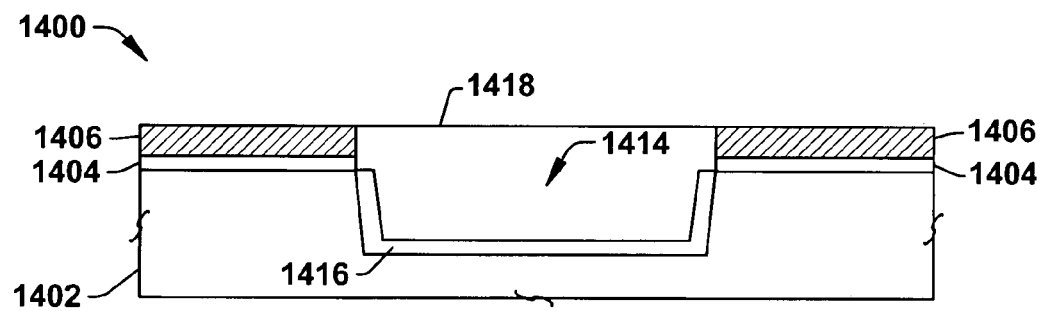
Figure 14I:
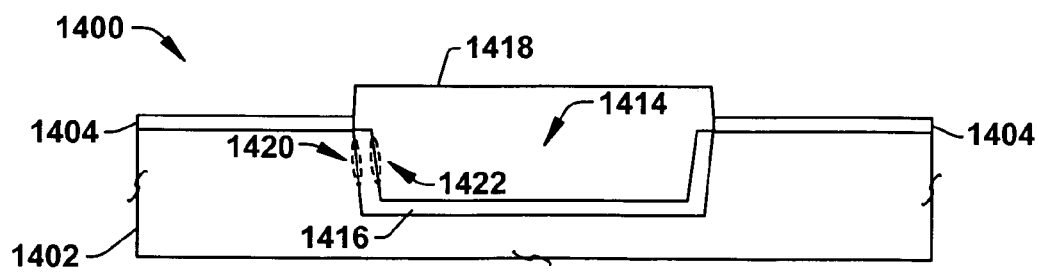

Continuing with FIG. 14H, a planarization process is performed to remove the upper portions of the fill material 1418 as well as upper portions of the hard mask layer 1406, wherein the hard mask layer 1406 serves as a planarization stop. The process can comprise a chemical-mechanical polishing (CMP) process wherein a generally planar upper surface is provided in the device 1400. Subsequently in FIG. 14I, the remainder of the hard mask layer 1406 is stripped or otherwise removed, leaving a finished STI isolation structure comprising the trench regions 1414 filled with dielectric material 1418 surrounded by a nitrogen containing line 1416 along sidewalls and bottoms of the trench regions 1414. A first interface 1420 is defined between the silicon material of the semiconductor body 1402 and the nitrogen containing liner 1416 and a second interface 1422 is defined between the nitrogen containing liner 1416 and the dielectric fill material 1418.

Thereafter, transistors, memory cells, and/or other electrical devices (not shown) may be formed in the active regions using semiconductor processing techniques as are known.

Figure 15:
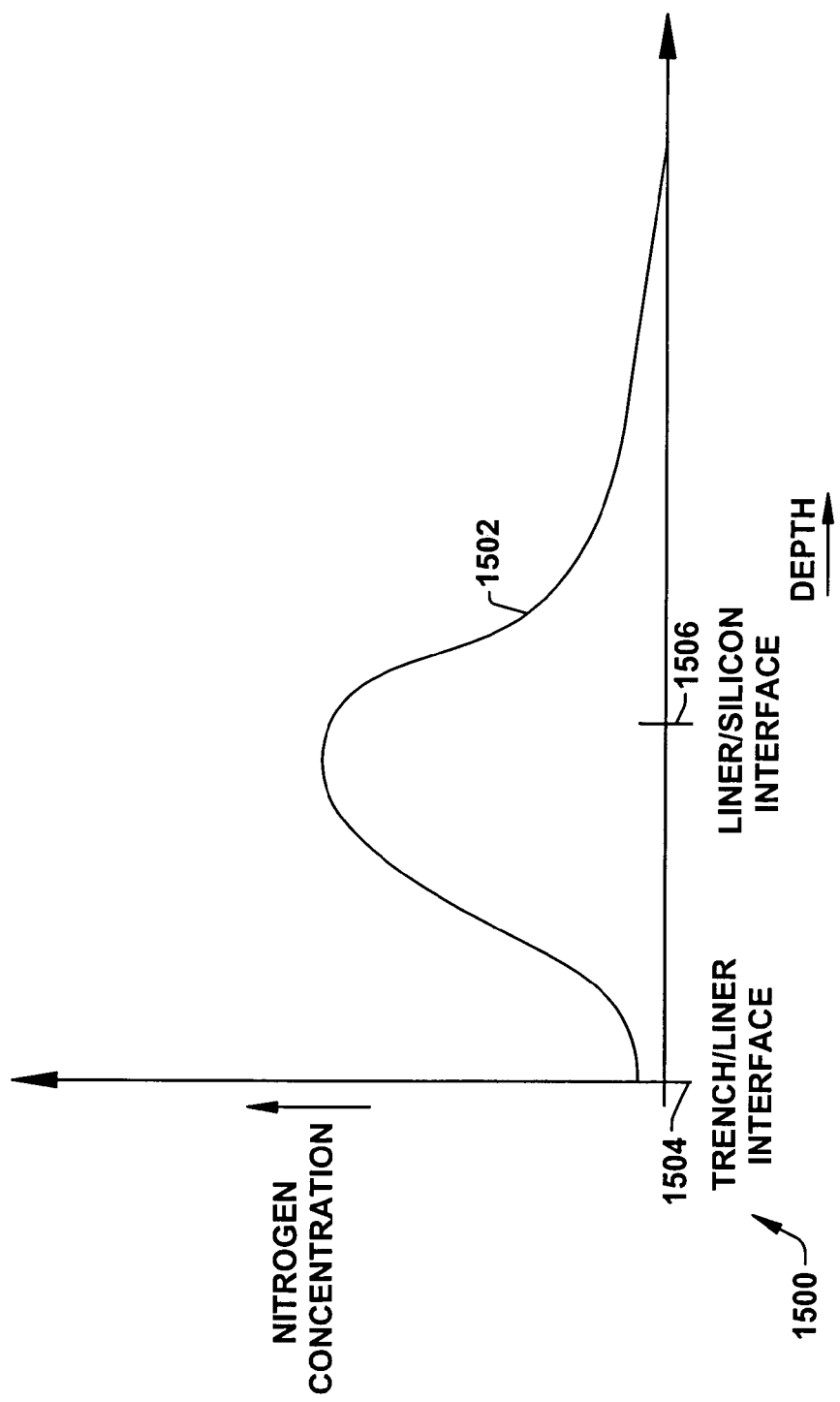
FIG. 15 is a graph depicting an exemplary nitrogen profile through a nitrogen containing liner in accordance with an aspect of the present invention.

FIG. 15 is a graph 1500 depicting an exemplary nitrogen profile 1502 through a nitrogen containing liner in accordance with an aspect of the present invention. The profile 1502 is taken through a cross section of the nitrogen containing liner from dielectric fill material to silicon within active regions of a device. The profile 1502 is representative of profiles that can be obtained employing methods of the present invention, but is exemplary in nature.

An x-axis represents depth through the liner from the dielectric fill material and a y-axis represents nitrogen concentration. At a trench/liner interface 1504, wherein dielectric fill material meets the nitrogen containing liner, such as shown at 1422 in FIG. 14I, the nitrogen concentration is relatively low. As the depth increases from the trench/liner interface, the nitrogen concentration increases until at about a liner/silicon interface 1506, wherein the nitrogen containing liner meets silicon substrate material, such as shown at 1420 in FIG. 14I. At this depth, the nitrogen concentration rapidly decreases as the depth passes into the silicon substrate, for example 5 nm.

It is noted that a relatively high concentration of nitrogen is present at the depth of the liner/silicon interface 1506. This relatively high concentration can mitigate undesired dopant diffusion for active regions, including channel regions, of semiconductor devices and can induce tensile stress into channel regions, which is beneficial for NMOS devices.

It is also noted that the nitrogen concentration can be increased overall within the liner by increasing the length of the nitridation process.

Figure 16:
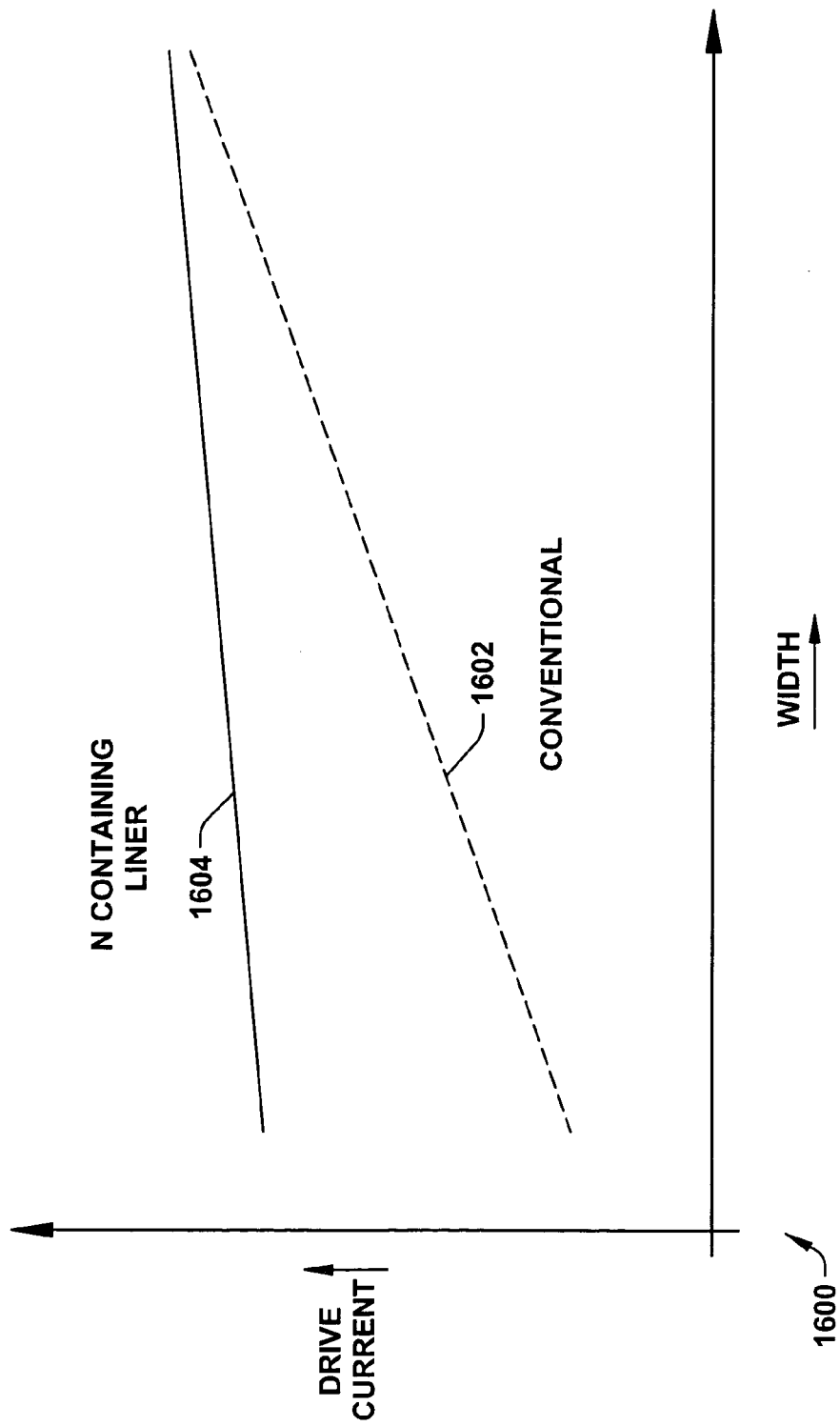
FIG. 16 is a graph depicting an exemplary drive current for a semiconductor device formed in accordance with the present invention as compared with drive current for a conventional semiconductor device.

FIG. 16 is a graph 1600 depicting an exemplary drive current for a semiconductor device formed in accordance with the present invention as compared with drive current for a conventional semiconductor device. The graph is exemplary in nature and is provided in order to facilitate a better understanding of the present invention.

An x-axis represents increasing width of a channel region for transistor devices and a y-axis represents increasing drive current. A line 1602 illustrates drive current versus width for a conventional transistor device that employs a conventional shallow trench isolation process. It can be seen that as the width decreases, the drive current for the conventional device decreases dramatically, due at least partially to the inverse width effect mentioned previously. This is particularly problematic for some transistor devices, such as narrow width SRAM devices that have channel widths of about 100 nm.

A line 1604 represents drive current versus width for a transistor device formed in accordance with an aspect of the present invention. The transistor device comprises a nitrogen containing liner. It can be seen that as the width decreases, the drive current performance of the transistor substantially exceeds the drive current performance of the conventional transistor as indicated by the line 1602.

As stated above, the graph 1600 is exemplary in nature, and shows improved drive current performance for a nitrogen containing liner produced transistor device of the present invention, line 1604, as compared with a conventional transistor device, line 1602. Actual values for drive current at various widths are not implied as such values can vary according to device chemistries and dimensions. However, for similar compositions and dimensions, the graph 1600 illustrates that improved drive current performance is generally obtained by employing a nitrogen containing liner in accordance with the present invention versus a conventional device that does not employ a nitrogen containing liner.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a semiconductor device containing isolation structures, the method comprising:
    defining isolation regions and active regions of a semiconductor body;
    forming trench regions within the isolation regions of the semiconductor body;
    nitriding surfaces of the trench regions including forming a nitride compound;
    oxidizing the nitrided surfaces of the trench regions including forming a nitride compound to form nitrogen containing liners; and
    filling the trench regions with a dielectric fill material.

2. The method of claim 1, wherein forming trench regions within isolation regions comprises forming a resist mask that exposes the isolation regions and etching the exposed regions for a selected time to form the trench regions with a bottom and sidewalls.

3. The method of claim 1, wherein forming trench regions within isolation regions comprises forming a hard mask that exposes the isolation regions and etching the exposed regions to form the trench regions with a bottom and sidewalls.

4. The method of claim 3, wherein the hard mask is comprised of silicon nitride.

5. The method of claim 1, wherein nitriding surfaces of the trench regions comprises performing a plasma based nitridation process.

6. The method of claim 2, wherein the plasma nitridation process is performed for a duration selected to obtain a desired nitrogen concentration at liner/substrate interfaces.

7. The method of claim 1, wherein the thermal growth process is performed for a duration selected according to a desired thickness for the nitrogen containing liners.

8. The method of claim 1, further comprising performing an anneal after forming the nitrogen containing liners.

9. The method of claim 1, wherein filling the trench regions comprises depositing oxide over the device.

10. The method of claim 1, wherein filling the trench regions comprises:
    forming a hard mask layer prior to forming the trench regions;
    depositing an oxide material in the trench regions using a high density plasma deposition process; and
    planarizing the device using the hard mask as a planarization stop.

11. The method of claim 10, wherein planarizing the device comprises performing a chemical mechanical polish of the oxide material.

12. The method of claim 1, further comprising forming transistor devices within the active regions of the semiconductor body.

13. A method of fabricating a semiconductor device containing isolation structures, the method comprising:
    forming a pad oxide layer over a semiconductor body;
    forming a hard mask layer on the pad oxide layer;
    forming a resist mask on the hard mask layer that exposes the hard mask layer within isolation regions and covers the hard mask layer within active regions of the device;
    patterning the hard mask layer to expose the semiconductor body within isolation regions;
    performing an etch process using the hard mask layer as a mask that forms trench regions within the isolation regions;
    nitriding exposed surfaces of the trench regions including forming a nitride compound;
    oxidizing the exposed surfaces of the trench regions to form nitrogen containing liners; and
    filling the trench regions with a dielectric fill material.

14. The method of claim 13, further comprising removing the resist layer prior to performing the etch process that forms trench regions.

15. The method of claim 13, further comprising removing the hard mask layer after filling the trench regions with the dielectric fill material.

16. A method of fabricating a semiconductor device containing isolation structures, the method comprising:

defining an isolation region of the semiconductor device;

performing an etch process using a mask that forms a trench region within the isolation region, wherein the trench region comprises a bottom surface and sidewall surfaces;

nitriding the bottom surface and the sidewall surfaces of the trench region;

oxidizing the nitrided bottom surface and the sidewall surfaces of the trench regions to form a nitrogen containing liner;

repairing damage incurred during the oxidizing with an anneal; and filling the trench region with a dielectric fill material.

17. The method of claim 16, wherein the anneal is performed for a duration selected according to a thickness of the nitrogen containing liner.

* * * * *